United States Patent
Yamamoto et al.

(10) Patent No.: US 6,844,769 B2
(45) Date of Patent: Jan. 18, 2005

(54) DRIVE CIRCUIT

(75) Inventors: Yasunori Yamamoto, Osaka (JP); Taishi Iwanaga, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/366,524

(22) Filed: Feb. 14, 2003

(65) Prior Publication Data

US 2003/0155958 A1 Aug. 21, 2003

(30) Foreign Application Priority Data

Feb. 20, 2002 (JP) ........................................ 2002-042635

(51) Int. Cl.$^7$ ............................................... H03L 5/00
(52) U.S. Cl. ..................... 327/333; 327/112; 327/390; 327/331; 326/81
(58) Field of Search ............................... 327/108, 112, 327/379, 389, 391, 333, 427, 390, 434, 437; 326/68, 80–83

(56) References Cited

U.S. PATENT DOCUMENTS

| | | | | |
|---|---|---|---|---|
| 5,739,700 A | * | 4/1998 | Martin | 326/80 |
| 5,896,045 A | * | 4/1999 | Siegel et al. | 326/81 |
| 5,973,508 A | * | 10/1999 | Nowak et al. | 326/81 |
| 6,031,394 A | * | 2/2000 | Cranford et al. | 326/81 |
| 6,040,729 A | * | 3/2000 | Sanchez et al. | 327/108 |

FOREIGN PATENT DOCUMENTS

JP 05-014174 A 1/1993

* cited by examiner

*Primary Examiner*—Long Nguyen
(74) *Attorney, Agent, or Firm*—McDermott Will & Emery LLP

(57) ABSTRACT

The amplitude expansion circuit as a main part of a drive circuit includes: a VM DC power supply line to which a voltage VM is applied; a VH DC power supply line to which a voltage VH roughly twice as high as the voltage VM is applied; an inverter circuit receiving a pulse signal oscillating between the ground voltage and the voltage VM; another inverter circuit receiving a pulse signal oscillating between the voltage VM and the voltage VH in correspondence with the oscillation of the voltage level of the above pulse signal; a p-channel MOSFET having a gate receiving an output from the inverter circuit; another p-channel MOSFET having a gate connected to the VM DC power supply line; an n-channel MOSFET having a gate connected to the VM DC power supply line; and another n-channel MOSFET having a gate receiving an output from the other inverter circuit. A common connection node of the p-channel MOSFET and the n-channel MOSFET works as the output terminal of the amplitude expansion circuit.

8 Claims, 5 Drawing Sheets

DRIVE CIRCUIT

BACKGROUND OF THE INVENTION

The present invention relates to a level shift circuit, an amplitude expansion circuit, and a drive circuit using these circuits.

In recent years, pulse width modulation (PWM) drive circuits have been often used for drive control of motors and actuators. To sufficiently turn on a power switching element of a push-pull circuit as a drive-stage circuit at the final stage, a predrive circuit preceding the push-pull circuit is required to output a voltage sufficiently higher than the power supply voltage for the push-pull circuit. For this purpose, the predrive circuit is normally formed using MOSFETs sufficiently high in breakdown voltage. With an output voltage from the predrive circuit, the gate voltage of the power switching element connected to a motor or an actuator is controlled, and by this control, PWM drive of the motor or the actuator is realized.

A conventional PWM drive circuit will be described with reference to FIG. 5. A PWM drive circuit shown in FIG. 5 includes a level shift amplitude expansion circuit 51 and a push-pull circuit 52 as a drive-stage circuit. The level shift amplitude expansion circuit 51 includes a level shift DC power supply line 53 for supplying a voltage VG, p-channel MOSFETs 54 and 55, and n-channel MOSFETs 56 and 57. The push-pull circuit 52 includes a drive-stage DC power supply line 58 for supplying a voltage VX and n-channel MOSFETs 59 and 60 as power switching elements. FIG. 5 also shows a control circuit 61 for controlling the level shift amplitude expansion circuit 51 and the push-pull circuit 52, a control circuit DC power supply line 62 for supplying a voltage VDD, an inverter circuit 63, and a load 64 such as a motor and an actuator, which are provided outside the PWM drive circuit.

The circuit 51, which is a circuit normally called a level shift circuit, is herein referred to as the level shift amplitude expansion circuit for the following reason. According to the present invention to be described later, a circuit for shifting the absolute level of a voltage while keeping the amplitude thereof unchanged is called a level shift circuit, while a circuit for expanding the amplitude of the level-shifted voltage is called an amplitude expansion circuit, and these circuits are handled separately.

The operation of the PWM drive circuit having the configuration described above is as follows.

A pulse signal with the amplitude of VDD is input into the gate terminal of the MOSFET 56 from the control circuit 61, and an inverted signal of the VDD-amplitude pulse signal is input into the gate terminal of the MOSFET 57 via the inverter circuit 63. When the gate terminal of the MOSFET 56 receives the "H" level and the gate terminal of the MOSFET 57 receives the "L" level, the MOSFET 56 is turned ON and the MOSFET 57 is turned OFF. The "L" level is then input into the gate terminal of the MOSFET 55, to is turn ON the MOSFET 55. This allows the voltage VG of the level shift DC power supply line 53 to be supplied to the gate terminal of the MOSFET 54 of the level shift amplitude expansion circuit 51 and the gate terminal of the MOSFET 59 of the push-pull circuit 52, turning OFF the MOSFET 54 and ON the MOSFET 59.

To ensure that the MOSFET 59 as a power switching element is reliably turned ON, the value of the voltage VG of the level shift DC power supply line 53 must sufficiently exceed the sum (VX+VT) of the voltage VX of the drive-stage DC power supply line 58 and a threshold voltage VT of the MOSFET 59. Note that the value of the voltage VDD also must be high enough to provide a gate voltage with which the MOSFET 60 as another switching element can be reliably turned ON. In general, however, this requirement can be easily satisfied.

In formation of the PWM drive circuit having the configuration described above, the level shift amplitude expansion circuit must operate with a power supply voltage exceeding the voltage (VX+VT) so that the power switching element on the upper arm side of the push-pull circuit 52 can be brought into complete conduction for full-swing drive. For this purpose, the level shift amplitude expansion circuit must be constructed of elements having a breakdown voltage sufficiently exceeding the power supply voltage. This breakdown voltage includes a gate breakdown voltage. To increase the gate breakdown voltage, a gate oxide film must be made thicker, and this increases the ON resistance. Elements of the drive-stage circuit and the level shift amplitude expansion circuit may be formed monolithically to have gate oxide films of different thicknesses determined to satisfy the respective necessary minimum gate breakdown voltages, that is, the respective breakdown voltages according to the voltages VX and VG. By forming in this way, the areas necessary for these circuits can be minimum. However, this complicates the process and also increases the cost.

The drive-stage circuit and the level shift amplitude expansion circuit may otherwise be formed so that the both circuits uniformly satisfy a higher one of the breakdown voltages required for the these circuits, that is, the gate breakdown voltage required for the level shift amplitude expansion circuit. In this case, however, the power switching element of the drive-stage circuit has an excessively large breakdown voltage margin. This increases the ON resistance per unit area, and thus excessively increases the size of the power switching element required to attain the necessary ON resistance, resulting in poor area efficiency.

SUMMARY OF THE INVENTION

An object of the present invention is providing a level shift circuit, an amplitude expansion circuit, and a drive circuit including these circuits, capable of outputting a signal of a voltage VG of which the crest value is roughly twice as high as that of the voltage VX so that the output signal is sufficiently higher than the voltage (VX+VT), using only low-voltage elements satisfying the breakdown voltage required for a power switching circuit of a drive-stage circuit.

Specifically, the amplitude expansion circuit of the present invention includes: a first DC power supply line to which a first potential is applied; a second DC power supply line to which a second potential is applied; an intermediate power supply line to which an intermediate potential between the first potential and the second potential is applied; a first inverter circuit receiving a first pulse signal changing between the first potential and the intermediate potential, the first inverter circuit operating with power supplies from the first DC power supply line and the intermediate power supply line; a second inverter circuit receiving an output signal from a level shift circuit, the level shift circuit level-shifting the first pulse signal to output a second pulse signal changing between the second potential and the intermediate potential, the second inverter circuit operating with power supplies from the second DC power supply line and the intermediate power supply line; a first MOSFET of one conductivity connected between the second DC power supply line and the first DC power supply line, a gate of the first MOSFET receiving an output signal from the second inverter circuit; a second MOSFET of the one conductivity connected between the first MOSFET and the first DC power supply line, a gate of the second MOSFET being connected to the intermediate power supply line; a third MOSFET of the other conductivity connected between the second MOSFET and the first DC power supply line, a gate of the third MOSFET receiving an output signal from the first inverter circuit; and a fourth MOSFET of the other conductivity connected between the second MOSFET and the third MOSFET, a gate of the fourth MOSFET being connected to the intermediate power supply line, wherein a common connection node of the second MOSFET and the fourth MOSFET is an output terminal of the amplitude expansion circuit.

According to the invention described above, the circuit can be constructed using MOSFETs having a breakdown voltage as low as about a half of the power supply voltage between the first and second DC power supply lines, and yet can output a signal higher than the gate breakdown voltage of the MOSFETs, because the output voltage is divided by the serial circuit of the first and second MOSFETs or the serial circuit of the third and fourth MOSFETs. Therefore, a signal with a large amplitude corresponding to full swing of the power supply voltage can be output in response to input of the first pulse signal low in signal level. In addition, with the circuit configuration using MOSFETs having a low gate breakdown voltage, the area of the MOSFETs and also the area of a semiconductor device integrating these MOSFETs can be reduced. When power switching elements are integrated into a semiconductor integrated circuit together with the level shift circuit and the amplitude expansion circuit for controlling the power switching elements, elements of the circuits can be formed in a simpler process because it is unnecessary to provide different breakdown voltages for the respective elements.

In the amplitude expansion circuit of the invention, preferably, a power supply voltage roughly the same as a power supply voltage applied between the first DC power supply line and the intermediate power supply line is applied between the intermediate power supply line and the second DC power supply line.

The amplitude expansion circuit of the invention preferably further includes: a fifth MOSFET of the other conductivity connected between a common connection node of the first MOSFET and the second MOSFET and the intermediate power supply line, a gate of the fifth MOSFET being connected to the second DC power supply line; and a sixth MOSFET of the one conductivity connected between a common connection node of the third MOSFET and the fourth MOSFET and the intermediate power supply line, a gate of the sixth MOSFET being connected to the first DC power supply line.

The amplitude expansion circuit of the invention preferably further includes a seventh MOSFET of the other conductivity connected between the second inverter circuit and the intermediate power supply line, a source, a drain and a gate of the seventh MOSFET being connected to a low-potential side power supply node of the second inverter circuit, the intermediate power supply line, and the second DC power supply line, respectively.

The amplitude expansion circuit of the invention preferably further includes an eighth MOSFET of the other conductivity connected between the fifth MOSFET and the intermediate power supply line, a source, a drain and a gate of the eighth MOSFET being connected to a source of the fifth MOSFET, the intermediate power supply line, and the second DC power supply line, respectively.

The predrive circuit of the present invention includes the amplitude expansion circuit according to the present invention described above and a level shift circuit. The level shift circuit includes: the first DC power supply line; the second DC power supply line; the intermediate power supply line; a third inverter circuit receiving the first pulse signal and operating with power supplies from the first DC power supply line and the intermediate power supply line; a fourth inverter circuit operating with power supplies from the second DC power supply line and the intermediate power supply line; a first diode having an anode connected to the intermediate power supply line and a cathode connected to an input node of the fourth inverter circuit; and a capacitor connected between an output node of the third inverter circuit and the input node of the fourth inverter circuit, wherein an output of the fourth inverter circuit is input into the second inverter circuit.

According to the present invention described above, the predrive circuit can be constructed using only low-voltage elements having a breakdown voltage of about only a half of the power supply voltage required for driving a switching element to be connected downstream, and yet can output an output amplitude roughly twice as high as the breakdown voltages.

In the predrive circuit of the invention, preferably, the level shift circuit further includes: a ninth MOSFET of the other conductivity connected between the fourth inverter circuit and the intermediate power supply line, a source, a drain and a gate of the ninth MOSFET being connected to a low-potential side power supply node of the fourth inverter circuit, the intermediate power supply line, and the second DC power supply line, respectively; and a tenth MOSFET of the other conductivity connected between the anode of the first diode and the intermediate power supply line, a source, a drain and a gate of the tenth MOSFET being connected to the anode of the first diode, the intermediate power supply line, and the second DC power supply line, respectively.

In the predrive circuit of the invention, preferably, the level shift circuit further includes: an eleventh MOSFET working as a high resistance, connected between the intermediate power supply line and the input node of the fourth inverter circuit, a gate of the eleventh MOSFET being connected to the second DC power supply line.

In the predrive circuit of the invention, preferably, the level shift circuit further includes: a twelfth MOSFET working as a high resistance, connected between the second DC power supply line and the input node of the fourth inverter circuit, a gate of the twelfth MOSFET being connected to the intermediate power supply line.

The drive circuit of the present invention includes the amplitude expansion circuit according to the present invention described above and a push-pull circuit. The push-pull circuit includes: a first power switching element connected between a predetermined power supply line and the first DC power supply line, a gate of the first power switching element receiving an output signal from the output terminal of the amplitude expansion circuit; and a second power switching element connected between the first power switching element and the first DC power supply line, a gate of the second power switching element receiving the first pulse signal, wherein a common connection node of the first power switching element and the second power switching element is an output terminal of the drive circuit.

According to the present invention described above, tho drive circuit can output the output amplitude roughly twice as high as the breakdown voltages, and thereby can sufficiently drive the power switching element even when the drive circuit composes the amplitude expansion circuit. The amplitude expansion circuit uses only low-voltage elements having a breakdown voltage about only a half of the power supply voltage required for driving the power switching element of the push-pull circuit to be connected downstream.

DESCRIPTION OF THE PREFERRED EMBODIMENTS

Figure 1:
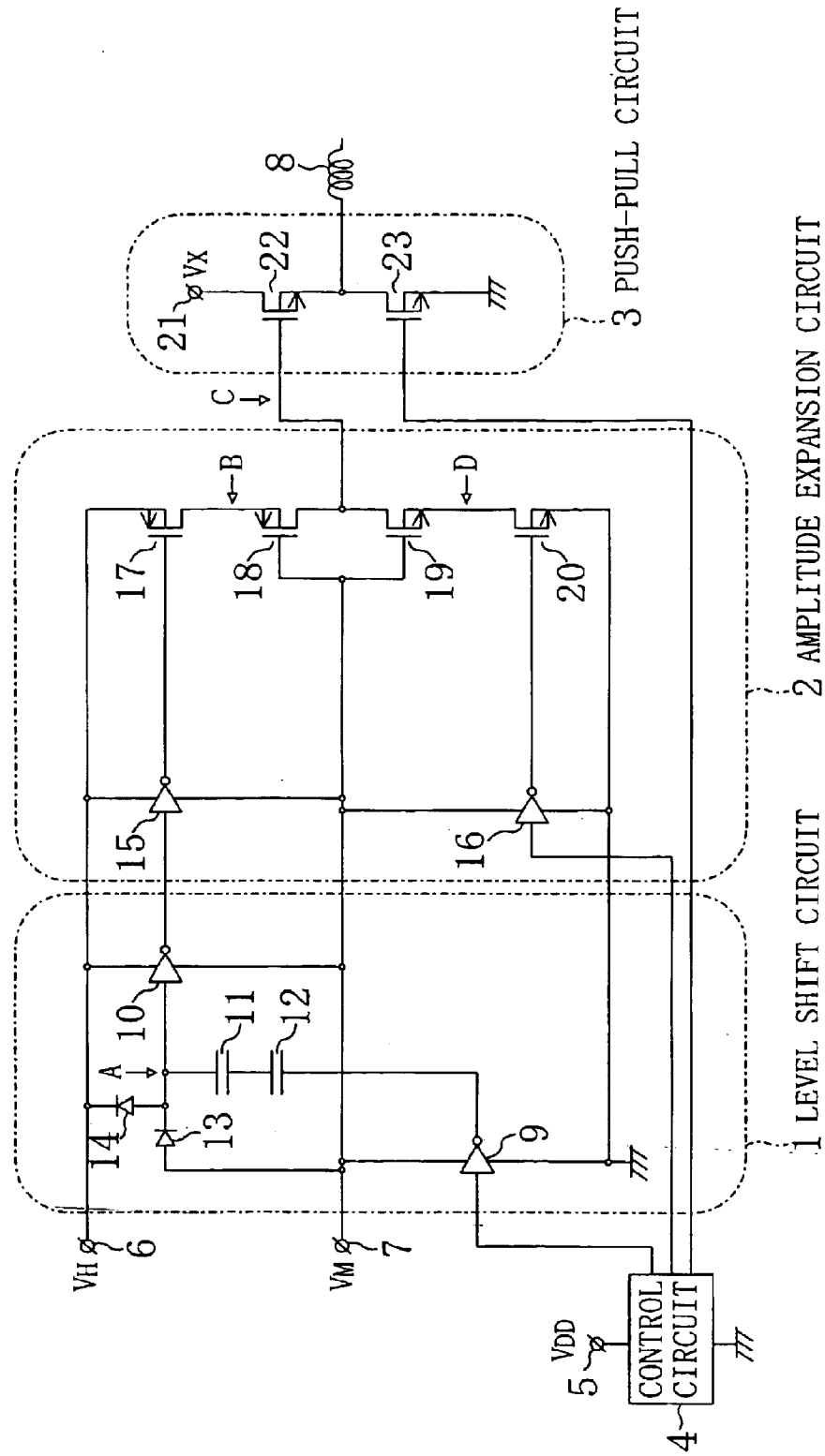
FIG. 1 is an explanatory illustration of a PWM drive circuit of Embodiment 1 of the present invention.

Hereinafter, preferred embodiments of the present invention will be described with reference to the accompanying drawings. Throughout the drawings, the same or like components are denoted by the same reference numerals, and detailed description thereof is not repeated.

Embodiment 1

FIG. 1 illustrates a PWM drive circuit of Embodiment 1, which includes a level shift circuit 1, an amplitude expansion circuit 2, and a push-pull circuit 3 as a drive-stage circuit. FIG. 1 also shows components outside the PWM drive circuit, which are a control circuit 4 for controlling the level shift circuit 1, the amplitude expansion circuit 2 and the push-pull circuit 3, a VDD power supply line 5 for supplying a DC voltage VDD, a VH power supply line 6 (second DC power supply line) for supplying a DC voltage VH (second potential), a VM power supply line 7 (intermediate power supply line) for supplying a DC voltage VM (intermediate potential), a ground line (first DC power supply line) connected to the ground, and a load 8 such as a motor and an actuator. The DC voltage VDD, the same voltage as that of the VDD power supply line 5, is applied to the VM power supply line 7, while a voltage roughly twice as high as the DC voltage VM is applied to the VH power supply line 6. Herein, a circuit including the level shift circuit 1 and the amplitude expansion circuit 2 is called a predrive circuit, and a circuit including the predrive circuit and the push-pull circuit 3 is called a drive circuit.

The level shift circuit 1 includes CMOS inverter circuits 9 and 10 (third and fourth inverter circuits), capacitors 11 and 12, a diode 13 (first diode) and a diode 14. In the illustrated example, the two capacitors 11 and 12 are serially connected between the output terminal (node) of the CMOS inverter circuit 9 and the input terminal (node) of the CMOS inverter circuit 10. Alternatively, three or more capacitors may be serially connected, or, a single capacitor may be provided if the capacitor has a high breakdown voltage.

The amplitude expansion circuit 2 includes CMOS inverter circuits 15 and 16 (second and first inverter circuits), p-channel MOSFETs 17 and 18 (first and second MOSFETs of one conductivity), and n-channel MOSFETs 19 and 20 (fourth and third MOSFETs of the other conductivity).

The push-pull circuit 3 includes a main circuit DC power supply line 21 (predetermined power supply line) for supplying a DC voltage VX having the same voltage level as the DC voltage VM, and n-channel MOSFETs 22 and 23 as power switching elements (first and second power switching elements). The push-pull circuit 3 is the same in configuration as the conventional push-pull circuit described above.

The operation of the PWM drive circuit of this embodiment having the configuration described above will be described.

First, the operation of the level shift circuit 1 will be described. As a precondition, the breakdown voltages of all the elements are in the level of just satisfying the DC voltage VM. In view of this, the DC voltage VM as the low voltage is first applied before application of the DC voltage VH. When the DC voltage VM is applied, a current flows to the capacitors 11 and 12 via the diode 13 to charge the capacitors. At this time, the potential of point A is (VM−VD) where VD is a drop voltage at the diode 13. Thereafter, the DC voltage VH as the high voltage is applied.

After the application of the DC voltage VH, a pulse signal (first pulse signal) with the amplitude of VDD from the control circuit 4 is input into the CMOS inverter circuit 9. When the CMOS inverter circuit 9 receives the "H" level, the point A is charged with the voltage (VM−VD), a value obtained by subtracting the voltage VM by the forward drop voltage VD of the diode 13. The CMOS inverter circuit 10 receives the voltage (VM−VD) and outputs the voltage VH. The voltage VD is normally sufficiently smaller than 0.7 V because the charge current is sufficiently small at the termination of the charging of the point A. When the CMOS inverter circuit 9 receives the "L" level, the potential of the point A becomes (VH−VD) because the voltage (VM−VD) is boosted with the output voltage VM from the COMS inverter circuit 9. The CMOS inverter circuit 10 therefore outputs the voltage VM. The diode 14 is provided for suppressing the potential of the point A from rising exceeding the voltage VH due to superimposition of spike noise and the like.

In the operation of the level shift circuit 1, the ranges of voltages applied to the terminals of the elements are as follows.

The CMOS inverter circuit 9, connected between the VM power supply line 7 and the ground line (GND), operates within the potential difference VM. As for the CMOS inverter circuit 10, connected between the VH power supply line 6 and the VM power supply line 7, the source-drain potential difference is equal to or less than VM. As for the diode 13, the anode is connected to the VM power supply line 7, and the potential of the cathode, that is, the potential of the point A only rises to (VH−VD) even when the capacitors boost the voltage. Therefore, the anode-cathode potential difference is equal to or less than VM. The capacitors 11 and 12 have a potential difference of (VH−VD) at maximum. However, since these capacitors are connected in series, it is only a half of the voltage, that is, a voltage equal to or less than the voltage VM, that is applied to each of the capacitors 11 and 12.

As described above, an input signal can be level-shifted using only low-voltage elements having breakdown voltages in the level of just satisfying the voltage VM.

Next, the operation of the amplitude expansion circuit 2 will be described. As described above, the CMOS inverter circuit 10 of the level shift circuit 1 outputs a level-shifted signal (second pulse signal) oscillating between the voltage VM and the voltage VH. The CMOS inverter circuit 15 receives this level-shifted pulse. The CMOS inverter circuit 16 receives a pulse signal with the VDD amplitude from the control circuit 4.

Suppose the CMOS inverter circuit 15 receives a signal of the voltage VH level and the CMOS inverter circuit 16 receives a signal of the voltage VM level. Then, the CMOS inverter circuit 15 outputs the voltage VM and the CMOS inverter circuit 16 outputs 0 V, and this turns ON the MOSFET 17 and OFF the MOSFET 20. The potential of point B is therefore equal to the voltage VH. Since the MOSFET 18 is also turned ON, the potential of point C, that is, the output of the amplitude expansion circuit 2 is equal to the voltage VH.

Likewise, suppose the CMOS inverter circuit 15 receives a signal of the voltage VM level and the CMOS inverter circuit 16 receives a signal of 0 V Then, the CMOS inverter circuit 15 outputs the voltage VH and the CMOS inverter circuit 16 outputs the voltage VM, and this turns OFF the MOSFET 17 and ON the MOSFET 20. The potential of point D is therefore roughly 0 V Since the MOSFET 19 is also turned ON, the potential of the point C, that is, the output of the amplitude expansion circuit 2 is roughly 0 V Thus, the amplitude expansion circuit 2 outputs 0 V or the voltage VH according to the inputs from the level shift circuit 1 and the control circuit 4.

In the operation of the amplitude expansion circuit 2, the ranges of voltages applied to the terminals of the elements are as follows.

The CMOS inverter circuit 16, connected between the VM power supply line 7 and GND, operates with an output amplitude equal to or less than the voltage difference VM. As for the CMOS inverter circuit 15, connected between the VH power supply line 6 and the VM power supply line 7, the inter-terminal potential difference is equal to or less than VM. The MOSFETs 17, 18, 19 and 20 operate with a voltage equal to or less than the inter-terminal potential difference VM of the respective elements, as discussed above in relation to the operation of the elements.

As described above, the amplitude of a signal input into the amplitude expansion circuit 2 can be expanded using only low-voltage elements having breakdown voltages in the level of just satisfying the voltage VM, to enable output of 0 V and the voltage VH.

To bring the MOSFET 22 as a power switching element (first power switching element) of the push-pull circuit 3 into complete conduction for drive control, the output voltage VH of the amplitude expansion circuit 2 is required to be a voltage sufficiently exceeding the sum (VX+VT) of the voltage VX of the main circuit DC power supply line 21 and a threshold voltage VT of the MOSFET 22. If the voltage VH satisfying this requirement can be twice or less as high as the voltage VM, the breakdown voltages required for the terminals of all the elements constituting the circuit are allowed to be within the voltage VM. In this way, the level shift circuit and the amplitude expansion circuit can be implemented using only low-voltage elements. Practically, there are many applications and uses under this condition.

In short, in this embodiment, it is possible to implement the level shift circuit 1 and the amplitude expansion circuit 2, which can output the voltage VH roughly twice as high as the voltage VM, using only low-voltage elements of which the breakdown voltage is VM. It is also possible to implement a predrive circuit including the level shift circuit 1 and the amplitude expansion circuit 2, and then a drive circuit including the predrive circuit and the push-pull circuit 3. Therefore, these circuits can be used as an interface circuit capable of externally outputting a signal with an amplitude roughly twice as high as the breakdown voltages required for the elements of the circuits. Moreover, with the amplitude expansion circuit capable of outputting the voltage VH level, the n-channel MOSFET 22 on the upper arm side of the push-pull circuit 3 can be brought into complete conduction, and this enables drive with an output amplitude providing full-swing between the voltage VX of the main circuit DC power supply and 0 V. Furthermore, the area of the power switching element can be reduced to the necessary minimum because it is only required to design the necessary minimum breakdown voltage in the level of the voltage VM for the power switching element.

Embodiment 2

Figure 2:
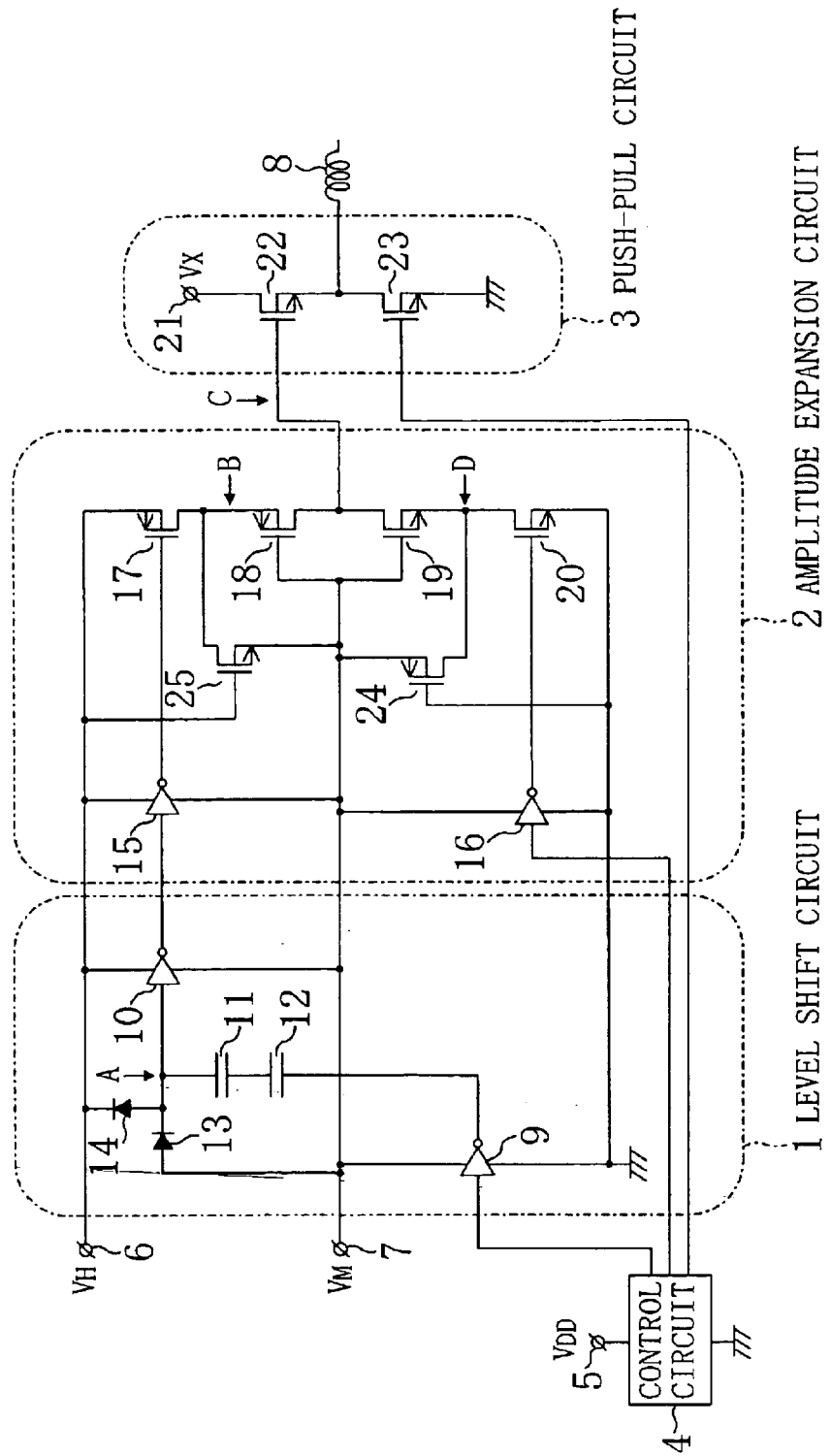
FIG. 2 is an explanatory illustration of a PWM drive circuit of Embodiment 2 of the present invention.

FIG. 2 illustrates a drive circuit of Embodiment 2 of the present invention. In FIG. 2, the following components are added to the configuration shown in FIG. 1. That is, the amplitude expansion circuit 2 additionally includes a p-channel MOSFET 24 (sixth MOSFET of one conductivity) and an n-channel MOSFET 25 (fifth MOSFET of the other conductivity). Hereinafter, these additional components will be described.

As described in Embodiment 1, the CMOS inverter circuit 10 of the level shift circuit 1 outputs a level-shifted signal oscillating between the voltage VH and the voltage VM. The CMOS inverter circuit 15 receives this level-shifted signal, while the CMOS inverter circuit 16 receives a pulse signal with the VDD amplitude from the control circuit 4.

Suppose the CMOS inverter circuit 15 receives a signal of the voltage VH level and the CMOS inverter circuit 16 receives a signal of the voltage VM level. Then, the CMOS inverter circuit 15 outputs the voltage VM and the CMOS inverter circuit 16 outputs 0 V, and this turns ON the MOSFET 17 and OFF the MOSFET 20. The potential of point B is therefore equal to the voltage VH. Since the MOSFET 18 is also turned ON, the potential of point C, that is, the output of the amplitude expansion circuit 2 is equal to the voltage VH.

In the above state, since the MOSFET 20 is OFF, the potential of point D is unstable. If the potential of the point D rises toward the power supply voltage VH of the VH power supply line 6 due to leakage and the like, a voltage exceeding the breakdown voltage of the low-voltage MOSFET 20 may be applied to the MOSFET 20, and this may possibly cause breakdown of the MOSFET 20. To prevent occurrence of this trouble, a MOSFET 24 having a sufficiently large resistance component, that is, having a large gate length is provided to allow flow of a microcurrent so that the potential of the point D is fixed to the voltage VM. By this fixation, the inter-terminal voltage difference of the MOSFET 20 can be suppressed to the level of the voltage VM, and thus the MOSFET 20 is prevented from breakdown.

Likewise, suppose the CMOS inverter circuit 15 receives a signal of the voltage VM level and the CMOS inverter circuit 16 receives a signal of 0 V. Then, the CMOS inverter circuit 15 outputs the voltage VH and the CMOS inverter circuit 16 outputs the voltage VM, and this turns OFF the MOSFET 17 and ON the MOSFET 20. The potential of point D is therefore 0 V. Since the MOSFET 19 is also turned ON, the potential of the point C, that is, the output of the amplitude expansion circuit 2 is 0 V.

In the above state, like the case described above, since the MOSFET 17 is OFF, the potential of the point B is unstable. If the potential of the point B drops toward 0 V due to leakage and the like, breakdown of the MOSFET 17 may occur. To prevent occurrence of this trouble, a MOSFET 25 having a large gate length is provided to allow flow of a microcurrent so that the potential of the point B is fixed to the voltage VM. By this fixation, the inter-terminal voltage difference of the MOSFET 17 can be suppressed to the level of the voltage VM, and thus the MOSFET 17 is prevented from breakdown.

As described above, the amplitude expansion circuit 2 can output 0 V or the voltage VH according to the inputs from the level shift circuit 1 and the control circuit 4 while preventing breakdown that may otherwise occur when the potential of the point B or D is unstable and oscillates due to leakage and the like.

In this embodiment, the MOSFETs 24 and 25 were used for prevention of breakdown. Alternatively, resistors may be used for this purpose.

In the operation of the amplitude expansion circuit 2, the ranges of voltages applied to the terminals of the elements are as follows.

The CMOS inverter circuit 16, connected between the VM power supply line 7 and GND, operates within the voltage difference VM. As for the CMOS inverter circuit 15, connected between the VH power supply line 6 and the VM power supply line 7, the inter-terminal potential difference is equal to or less than VM. The MOSFETs 24 and 25 operate to loosely fix the potentials of the points D and B in a high-impedance floating state to the voltage VM, as described above. Therefore, the gate-source and gate-drain potential differences of the MOSFETs 17, 18, 19, 20, 24 and 25 are in the level of the voltage VM.

Thus, the amplitude expansion circuit 2 can expand the amplitude of an input signal using only low-voltage elements having breakdown voltages in the level of just satisfying the voltage VM, to enable output of 0 V and the voltage VH.

As described above, in this embodiment, voltage rise or voltage drop at unstable potential points due to leakage and the like can be suppressed, and thus the MOSFETs is prevented from breakdown. In addition, it is possible to implement the level shift circuit 1 and the amplitude expansion circuit 2, which can output the voltage VH roughly twice as high as the voltage VM, using only low-voltage elements of which the breakdown voltage is VM. It is also possible to implement a predrive circuit including the level shift circuit 1 and the amplitude expansion circuit 2, and then a drive circuit including the predrive circuit and the push-pull circuit 3. Therefore, as in Embodiment 1, these circuits can be used as an interface circuit capable of externally outputting a signal with an amplitude roughly twice as high as the breakdown voltage required for the elements of the circuits. Moreover, with the amplitude expansion circuit capable of outputting the voltage VH level, the n-channel MOSFET 22 on the upper arm side of the push-pull circuit 3 can be brought into complete conduction, and this enables full-swing drive between the voltage VX of the main circuit DC power supply and 0 V. Furthermore, the area of the power switching element can be reduced to the necessary minimum because it is only required to design the necessary minimum breakdown voltage in the level of the voltage VM for the power switching element.

Embodiment 3

Figure 3:
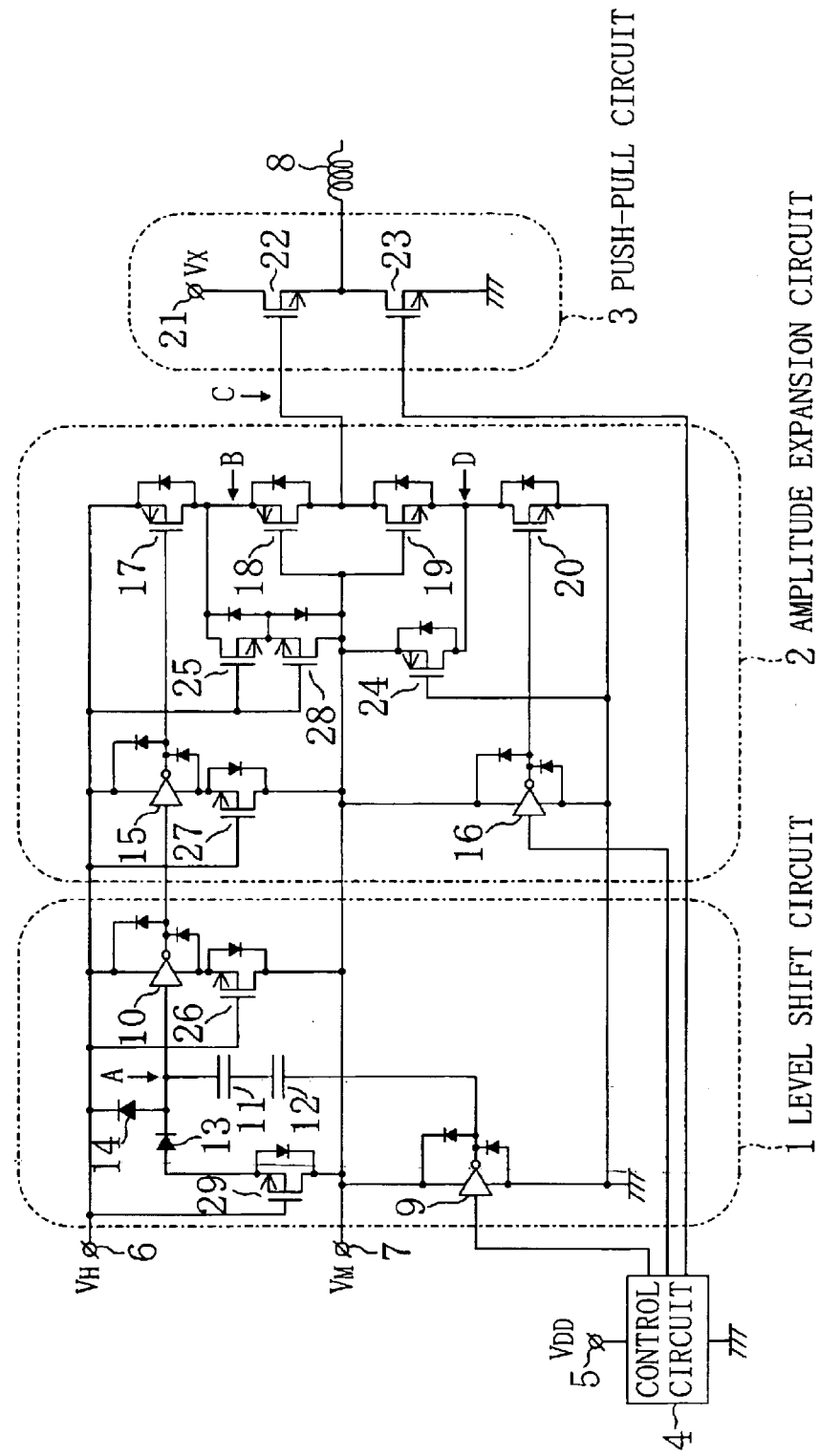
FIG. 3 is an explanatory illustration of a PWM drive circuit of Embodiment 3 of the present invention.

FIG. 3 illustrates a PWM drive circuit of Embodiment 3 of the present invention. In FIG. 3, n-channel MOSFETs 26, 27, 28 and 29 (ninth, seventh, eighth and tenth MOSFETs of the other conductivity) are added to the configuration shown in FIG. 2. In FIG. 3, also, parasitic diodes are depicted for the respective MOSFETs and inverters. Note that the position of each parasitic diode is based on the assumption that the p-well potential of each n-channel MOSFET can be handled independently using a process of forming an n-type layer between the p-well potential and a p-type substrate of the n-channel MOSFET, an insulation separation process or an SOI process.

As described before, as the order of application of the power supply voltages for prevention of breakdown, the power supply voltage VM is first applied to the VM power supply line 7, and then the power supply voltage VH is applied to the VH power supply line 6. In this relation, in the state where a voltage has been applied to the VM power supply line 7 but no voltage has yet been applied to the VH power supply line 6, a current may flow from the VM power supply line 7 to the VH power supply line 6 via the parasitic diodes of MOSFETs constituting the CMOS inverters 10 and 15, via the diodes 13 and 14, or via the parasitic diodes of the n-channel MOSFET 25 and the p-channel MOSFET 17.

For prevention of flow of a current described above, the n-channel MOSFETs 26, 27, 28 and 29 are interposed between the VM power supply line 7 and the CMOS inverters 10 and 15, the n-channel MOSFET 25 and the diode 13, respectively. The source terminals of the n-channel MOSFETs 26, 27, 28 and 29 are connected to the low-potential terminals of the CMOS inverters 10 and 15, the n-channel MOSFET 25 and the diode 13, respectively, the gate terminals are connected to the VH power supply line 6, and the drain terminals are connected to the VM power supply line 7. Once a voltage is applied to the VH power supply line 6, the voltage VH is applied to the gate terminals of the n-channel MOSFETs 26, 27, 28 and 29. Therefore, during the application of the voltage VH, the n-channel MOSFETs 26, 27, 28 and 29 are kept in the ON state. Since there is no drain-source potential difference in the On-state n-channel MOSFETs, no current flows from the VH power supply line 7 to the VH power supply line 6. Therefore, the CMOS inverters 10 and 15, the n-channel MOSFET 25 and the diode 13 operate as described above with reference to FIG. 2. The breakdown voltage required for the n-channel MOSFETs 26, 27, 28 and 29 may be in the level of the voltage VM.

As described above, by newly providing the n-channel MOSFETs 26, 27, 28 and 29, of which the source and the drain are connected opposite to the normal direction, a reverse current flow from the VM power supply line 7 to the VH power supply line 6 is prevented.

The voltage at the input terminal of the inverter circuit 10 may become unstable if input of a pulse signal into the inverter circuit 9 from the control circuit 4 is stopped and a long time has passed since the stop. In this event, the potential of the point A may possibly become an intermediate value between the voltage VH and the voltage VM, and when this happens, a through current from the VH power supply line 6 to the VM power supply line 7 may flow via the inverter circuit 10.

Figure 4A:
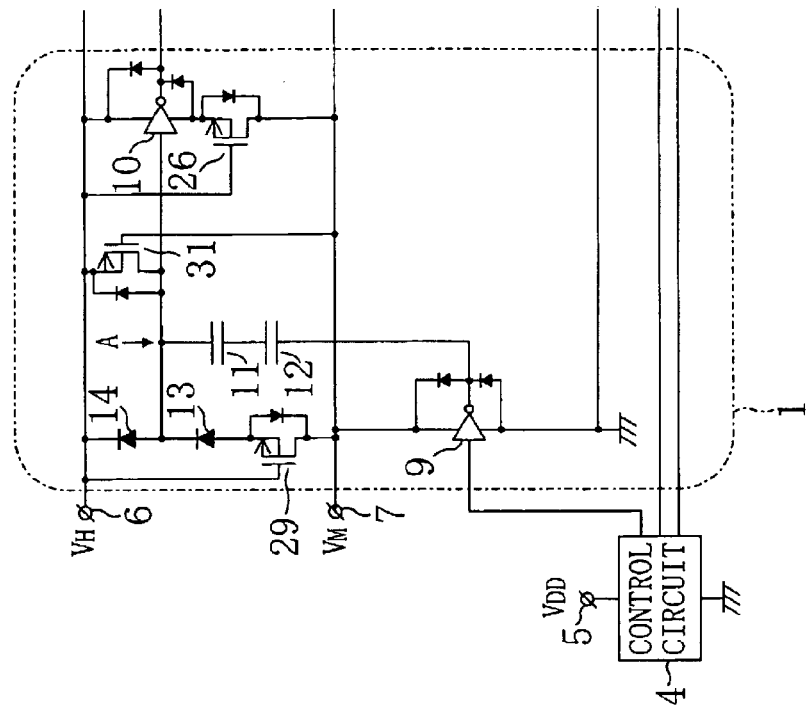
FIGS. 4A and 4B are explanatory illustrations of alterations to a level shift circuit of the present invention.
Figure 4B:
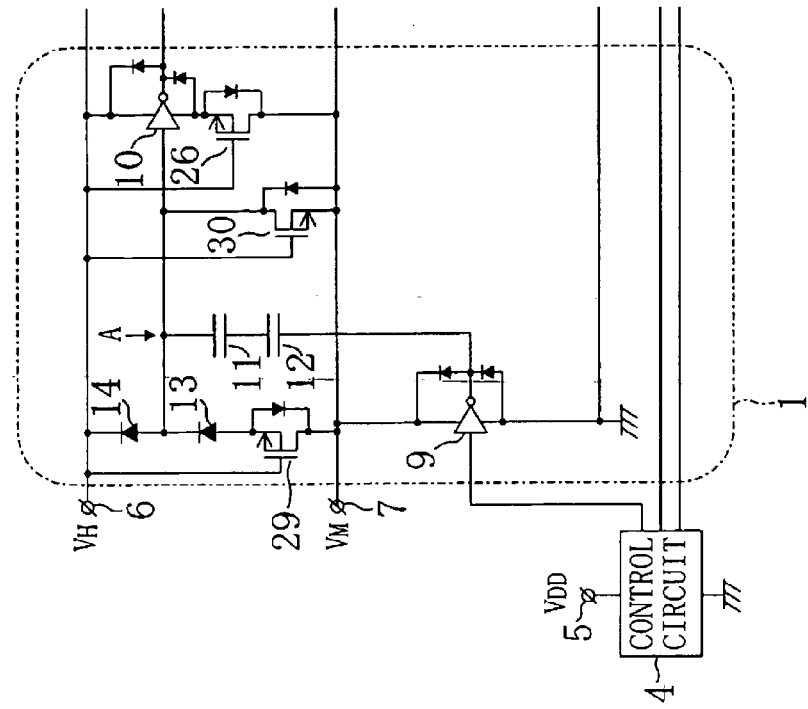
Figure 5:
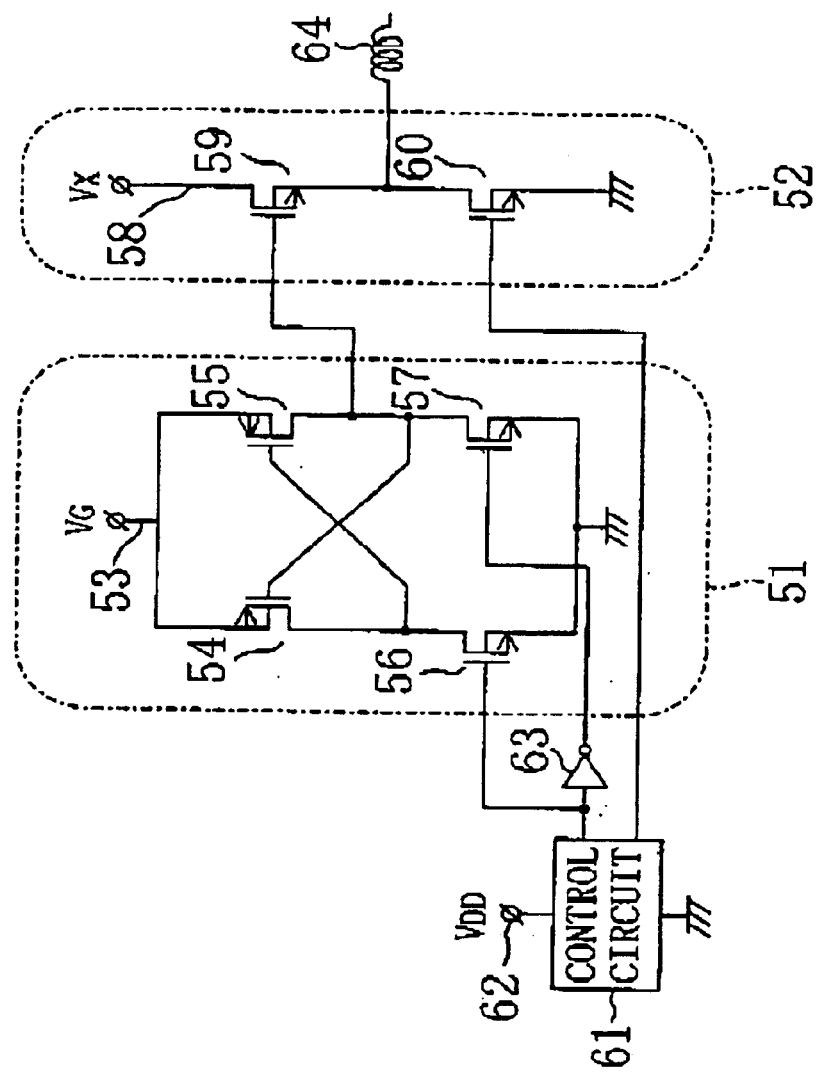
FIG. 5 is an explanatory illustration of a conventional PWM drive circuit.

FIGS. 4A and 4B illustrate examples of the circuit diagram of the level shift circuit 1 for preventing flow of a through current described above. In the level shift circuit 1 shown in FIG. 4A, additionally provided is an n-channel MOSFET 30 (eleventh MOSFET of the other conductivity) having a gate length sufficiently large with respect to the gate width so as to work as a MOS resistance having a considerably high ON resistance. With this configuration, the potential of the point A is loosely fixed to the voltage VM level in the event of a long-time stop of input of a pulse signal, and thus generation of a through current is prevented.

In the level shift circuit 1 shown in FIG. 4B, a p-channel MOSFET 31 (twelfth MOSFET of one conductivity) working as a MOS resistance as in the above case is additionally provided. With this configuration, the potential of the point A is fixed to the voltage VH level in the event of a long-time stop of input of a pulse signal, and thus generation of a through current is prevented.

Note that a MOS resistance may be placed somewhere between the gate and the source of the p-channel MOSFET 17 of the amplitude expansion circuit 2 so that the p-channel MOSFET 17 is turned OFF in the event of a stop of input of a pulse signal. By this placement, the MOSFETs 17, 18, 19 and 20 can be prevented from breakdown even when the n-channel MOSFET 20 is turned ON. Naturally, in place of the MOSFETs 30 and 31 working as a considerably high resistance, a resistance may be used theoretically.

The source terminal of the n-channel MOSFET 22 on the upper arm side of the push-pull circuit 3 may be short-circuited by accident. To prevent the n-channel MOSFET 22 from breakdown in this event, a logic circuit, capable of putting the potential of the point C into the "L" level or a high-impedance state when the gate-source potential difference of the n-channel MOSFET 22 exceeds the level of the voltage VM, may be placed at a position preceding the p-channel MOSFET 17 of the amplitude expansion circuit 2.

In the embodiments described above, the low-potential power supply line was grounded (GND), and the highest potential was applied to the VH power supply line 6. The present invention is not limited to this, but the low-potential power supply line may be connected to a negative power supply, the VM power supply line 7 may be grounded (GND), and the VH power supply line 6 may be connected to a positive power supply.

Alternatively, the VH power supply line 6 may be connected to a negative power supply, the low-potential power supply line may be grounded (GND), and a potential about a half of the potential difference between the potential of the VH power supply line 6 and the ground potential may be applied to the VM power supply line 7. In this case, however, the conductivities of the MOSFETs in the embodiments described above must be reversed, that is, the p-channel MOSFETs and the n-channel MOSFETs must be exchanged with each other. The present invention is also applicable to this configuration, in which the highest potential is applied to the ground line and the lowest potential is applied to the VH power supply line 6.

As described above, the amplitude expansion circuit of the present invention is constructed using only low-voltage elements having a breakdown voltage about a half of the DC voltage VH required for sufficiently driving the power switching element of the push-pull circuit, and yet can output the DC voltage VH that is roughly twice as high as the voltage VM.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. An amplitude expansion circuit comprising:

a first DC power supply line to which a first potential is applied;

a second DC power supply line to which a second potential is applied;

an intermediate power supply line to which an intermediate potential between the first potential and the second potential is applied;

a first inverter circuit receiving a first pulse signal changing between the first potential and the intermediate potential, the first inverter circuit operating with power supplies from the first DC power supply line and the intermediate power supply line;

a second inverter circuit receiving a second pulse signal outputted from a level shift circuit, the second pulse signal changing between the second potential and the intermediate potential, the second inverter circuit operating with power supplies from the second DC power supply line and the intermediate power supply line;

a first MOSFET of one conductivity connected between the second DC power supply line and the first DC power supply line, a gate of the first MOSFET receiving an output signal from the second inverter circuit;

a second MOSFET of the one conductivity connected between the first MOSFET and the first DC power supply line, a gate of the second MOSFET being connected to the intermediate power supply line;

a third MOSFET of the other conductivity connected between the second MOSFET and the first DC power supply line, a gate of the third MOSFET receiving an output signal from the first inverter circuit; and a fourth MOSFET of the other conductivity connected between the second MOSFET and the third MOSFET, a gate of the fourth MOSFET being connected to the a fifth MOSFET of the other conductivity connected between a common connection node of the first MOSFET and the second MOSFET and the intermediate power supply line, a gate of the fifth MOSFET being connected to the second DC power supply line; and a sixth MOSFET of the one conductivity connected between a common connection node of the third MOSFET and the fourth MOSFET and the intermediate power supply line, a gate of the sixth MOSFET being connected to the first DC power supply line.

wherein a common connection node of the second MOSFET and the forth MOSFET is an output terminal of the amplitude expansion circuit.

2. The amplitude expansion circuit of claim 1, further comprising a seventh MOSFET of the other conductivity connected between the second inverter circuit and the intermediate power supply line, a source, a drain and a gate of the seventh MOSFET being connected to a low-potential side power supply node of the second inverter circuit, the intermediate power supply line, and the second DC power supply line, respectively.

3. The amplitude expansion circuit of claim 1, further comprising an eighth MOSFET of the other conductivity connected between the fifth MOSFET and the intermediate power supply line, a source, a drain and a gate of the eighth MOSFET being connected to a source of the fifth MOSFET, the intermediate power supply line, and the second DC power supply line, respectively.

4. A predrive circuit comprising:

the amplitude expansion circuit;

level shift circuit;

the first DC power supply line;

the second DC power supply line;

an intermediate power supply line to which an intermediate potential between the first potential and the second potential is applied;

wherein the amplitude expansion circuit includes:

a first inverter circuit receiving a first pulse signal changing between the first potential and the intermediate potential, the first inverter circuit operating with power supplies from the first DC power supply line and the intermediate power supply line;

a second inverter circuit receiving a second pulse signal outputted from a level shift circuit, the second pulse signal changing between the second potential and the intermediate potential, the second inverter circuit operating with power supplies from the second DC power supply line and the intermediate power supply line;

a first MOSFET of one conductivity connected between the second DC power supply line and the first DC power supply line, a gate of the first MOSFET receiving an output signal from the second inverter circuit;

a second MOSFET of the one conductivity connected between the first MOSFET and the first DC power supply line, a gate of the second MOSFET being connected to the intermediate power supply line;

a third MOSFET of the other conductivity connected between the second MOSFET and the first DC power supply line, a gate of the third MOSFET receiving an output signal from the first inverter circuit; and a fourth MOSFET of the other conductivity connected between the second MOSFET and the third MOSFET, a gate of the fourth MOSFET being connected to the intermediate power supply line, wherein a common connection node of the second MOSFET and the fourth MOSFET is an output terminal of the amplitude expansion circuit, wherein the level shift circuit includes:

a third inverter circuit operating with power supplies from the first DC power supply line and the intermediate power supply line;

a fourth inverter circuit operating with power supplies from the second DC power supply line and the intermediate power supply line;

a first diode having an anode connected to the intermediate power supply line and a cathode connected to an input node of the fourth inverter circuit; and a capacitor connected between an output node of the third inverter circuit and the input node of the fourth inverter circuit, wherein an output of the fourth inverter circuit is input into the second inverter circuit.

5. The predrive circuit of claim 4, wherein the level shift circuit further comprises:

a ninth MOSFET of the other conductivity connected between the fourth inverter circuit and the intermediate power supply line, a source, a drain and a gate of the ninth MOSFET being connected to a low-potential side power supply node of the fourth inverter circuit, the intermediate power supply line, and the second DC power supply line, respectively; and a tenth MOSFET of the other conductivity connected between the anode of the first diode and the intermediate power supply line, a source, a drain and a gate of the tenth MOSFET being connected to the anode of the first diode, the intermediate power supply line, and the second DC power supply line, respectively.

6. The predrive circuit of claim 4 or 5, wherein the level shift circuit further comprises:

an eleventh MOSFET connected between the intermediate power supply line and the input node of the fourth inverter circuit, a gate of the eleventh MOSFET being connected to the second DC power supply line.

7. The predrive circuit of claim 4 or 5, wherein the level shift circuit further comprises:

a twelfth MOSFET connected between the second DC power supply line and the input node of the fourth inverter circuit, a gate of the twelfth MOSFET being connected to the intermediate power supply line.

8. A drive circuit comprising:

an amplitude expansion circuit;

a push-pull circuit;

a first DC power supply line to which a first potential is applied;

a second DC power supply line to which a second potential is applied; and an intermediate power supply line to which an intermediate potential between the first potential and the second potential is applied;

wherein the amplitude expansion circuit includes:

a first inverter circuit receiving a first pulse signal changing between the first potential and the intermediate potential, the first inverter circuit operating with power supplies from the first DC power supply line and the intermediate power supply line;

a second inverter circuit receiving a second pulse signal outputted from a level shift circuit, the second pulse signal changing between the second potential and the intermediate potential, the second inverter circuit operating with power supplies from the second DC power supply line and the intermediate power supply line;

a first MOSFET of one conductivity connected between the second DC power supply line and the first DC power supply line, a gate of the first MOSFET receiving an output signal from the second inverter circuit;

a second MOSFET of the one conductivity connected between the first MOSFET and the first DC power supply line, a gate of the second MOSFET being connected to the intermediate power supply line;

a third MOSFET of the other conductivity connected between the second MOSFET and the first DC power supply line, a gate of the third MOSFET receiving an output signal from the first inverter circuit; and a fourth MOSFET of the other conductivity connected between the second MOSFET and the third MOSFET, a gate of the fourth MOSFET being connected to the intermediate power supply line, a fifth MOSFET of the other conductivity connected between a common connection node of the first MOSFET and the second MOSFET and the intermediate power supply line, a gate of the fifth MOSFET being connected to the second DC power supply line; and a sixth MOSFET of the one conductivity connected between a common connection node of the third MOSFET and the fourth MOSFET and the intermediate power supply line, a gate of the sixth MOSFET being connected to the first DC power supply line, wherein a common connection node of the second MOSFET and the fourth MOSFET is an output terminal of the amplitude expansion circuit, wherein the push-pull circuit includes:
  a first power switching element connected between a predetermined power supply line and the first DC power supply line, a gate of the first power switching element receiving an output signal from the output terminal of the amplitude expansion circuit; and
  a second power switching element connected between the first power switching element and the first DC power supply line, wherein a common connection node of the first power switching element and the second power switching element is an output terminal of the drive circuit.

* * * * *